(12) United States Patent
Miyake

(10) Patent No.: US 11,211,545 B2
(45) Date of Patent: Dec. 28, 2021

(54) VIBRATION CONTROLLER

(71) Applicant: YAMAHA CORPORATION, Hamamatsu (JP)

(72) Inventor: Yoshiro Miyake, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 754 days.

(21) Appl. No.: 16/108,671

(22) Filed: Aug. 22, 2018

(65) Prior Publication Data

US 2018/0366636 A1 Dec. 20, 2018

Related U.S. Application Data

(63) Continuation of application No. PCT/JP2017/006314, filed on Feb. 21, 2017.

(30) Foreign Application Priority Data

Mar. 1, 2016 (JP) .............................. JP2016-039045
Sep. 16, 2016 (JP) .............................. JP2016-181339

(51) Int. Cl.
| H01L 41/09 | (2006.01) |
|---|---|
| H01L 41/04 | (2006.01) |
| H03H 11/48 | (2006.01) |
| G05D 19/02 | (2006.01) |
| F16F 15/00 | (2006.01) |
| F16F 15/02 | (2006.01) |
| H01L 41/047 | (2006.01) |
| H03H 11/52 | (2006.01) |

(52) U.S. Cl.
CPC ............ *H01L 41/09* (2013.01); *F16F 15/005* (2013.01); *F16F 15/02* (2013.01); *G05D 19/02* (2013.01); *H01L 41/042* (2013.01); *H01L 41/047* (2013.01); *H03H 11/48* (2013.01); *H03H 11/485* (2013.01); *H03H 11/52* (2013.01)

(58) Field of Classification Search
CPC ...... H01L 41/09; H01L 41/047; H01L 41/042
USPC ................................................. 310/314, 317
See application file for complete search history.

(56) References Cited

U.S. PATENT DOCUMENTS

| 3,824,496 A | 7/1974 | Hekimian |
| 6,075,309 A | 6/2000 | Wu |
| 6,163,101 A | 12/2000 | Yoshida |
| 9,506,521 B2 | 11/2016 | Yamazaki |
| 2005/0099236 A1* | 5/2005 | Kawakubo ............ H03B 5/366 331/107 A |

(Continued)

FOREIGN PATENT DOCUMENTS

| CN | 1237830 A | 12/1999 |
| CN | 102759842 A | 10/2012 |
| CN | 105313632 A | 2/2016 |
| EP | 0744558 A1 | 11/1996 |
| EP | 1179493 A2 | 2/2002 |
| JP | 2002061708 A | 2/2002 |

(Continued)

OTHER PUBLICATIONS

Office Action issued in Japanese Appln. No. 2016-181339 dated Sep. 15, 2020. English machine translation provided.

(Continued)

*Primary Examiner* — Derek J Rosenau
(74) *Attorney, Agent, or Firm* — Rossi, Kimms & McDowell LLP

(57) ABSTRACT

A vibration controller includes: a piezoelectric element fixed to an object of control; and a quasi-inductor circuit and a negative resistance circuit connected in series to the piezoelectric element.

4 Claims, 6 Drawing Sheets

(56) References Cited

U.S. PATENT DOCUMENTS

2012/0274243 A1 11/2012 Sumioka
2017/0038491 A1* 2/2017 Gonzalez .............. G01N 11/16

FOREIGN PATENT DOCUMENTS

| JP | 2003285738 A | 10/2003 |
|----|--------------|---------|
| JP | 2005254957 A | 9/2005 |
| JP | 2012156946 A | 8/2012 |

OTHER PUBLICATIONS

Extended European Search Report issued in European Appln. No. 17759733.3 dated Sep. 30, 2019.
Morgan et al. "Active-Passive Piezoelectric Absorbers for Systems Under Multiple Non-Stationary Harmonic Excitations." Journal of Sound and Vibration. vol. 255, No. 4, 2002, pp. 685-700.
Ferri et al. "Vibration Damping Using CCII-Based Inductance Simulators." IEEE Transactions on Instrumentation and Measurement. vol. 57, No. 5, May 2008, pp. 907-914.
Jörg Rehrmann Electronics. "Gyrator." Nov. 2, 2012. Web [retrieved on Sep. 9, 2019] URL:https://web.archive.org/web/20121102151418/http://www.joretronik.de/Gyratoren/Gyrator.html. English machine translation provided.
Office Action issued in Chinese Application No. 201780014017.4 dated Dec. 30, 2019. English translation provided.
International Search Report issued in Intl. Appln. No PCT/JP2017/006314 dated Mar. 28, 2017. English translation provided.
Written Opinion issued in Intl. Appln. No. PCT/JP2017/006314 dated Mar. 28, 2017.

* cited by examiner

VIBRATION CONTROLLER

BACKGROUND OF THE INVENTION

Field of the Invention

The present invention relates to a vibration controller that controls vibration of various control objects.

Description of Related Art

Japanese Patent Application Laid-Open Publication No. 2002-061708 and Japanese Patent Application Laid-Open Publication No. 2003-285738 set forth various vibration controllers that include, for example, piezoelectric elements. In use of such vibration controllers, an inductor is connected to a piezoelectric element, and the element is fixed to an object of control. The inductor together with a parasitic capacitor provided in the piezoelectric element form a resonant circuit. The resonant circuit resonates at a natural frequency of the object of control. By use of this configuration, energy generated by vibration of the object of control is reduced by the resonant circuit to thereby dampen vibration of the object of control.

In the foregoing conventional vibration controllers, the resonant circuit has a parasitic resistor. This parasitic resistor reduces a Quality Factor (hereinafter, "Q") of resonance, whereby a problem arises in that vibration in an object of control cannot be sufficiently dampened.

SUMMARY OF THE INVENTION

In view of the foregoing circumstances, the present invention has as its object the provision of a vibration controller that is capable of increasing a Q of resonance, and is also capable of effectively reducing vibration energy of an object of control.

The present invention provides a vibration controller including: a piezoelectric element fixed to an object of control, and an inductor and a negative resistance circuit connected in series to the piezoelectric element.

DESCRIPTION OF THE EMBODIMENTS

Embodiments of the present invention will be described below with reference to the drawings.

First Embodiment

Figure 1:
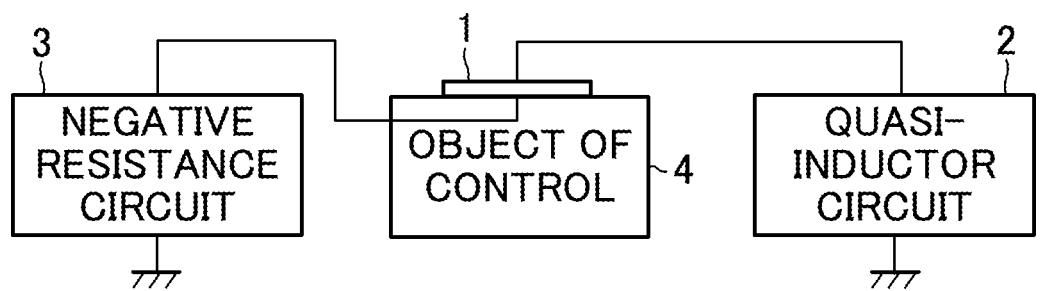
FIG. 1 is a block diagram illustrating a configuration of a vibration controller according to a first embodiment of this invention.

FIG. 1 is a block diagram illustrating a configuration of a vibration controller according to a first embodiment of this invention. As illustrated in FIG. 1, the vibration controller according to the present embodiment includes: a piezoelectric element 1 fixed to a surface of an object of control (an object in which vibration is to be controlled) 4, such as a musical instrument or a speaker housing; a quasi-inductor circuit 2 provided between one of the two electrodes of the piezoelectric element 1 and a grounding wire; and a negative resistance circuit 3 provided between the other electrode of the piezoelectric element 1 and a grounding wire. Preferably, the piezoelectric element 1 is fixed to the object of control 4, at position where maximum distortion occurs in generation of natural vibration in the object of control 4.

Figure 2:
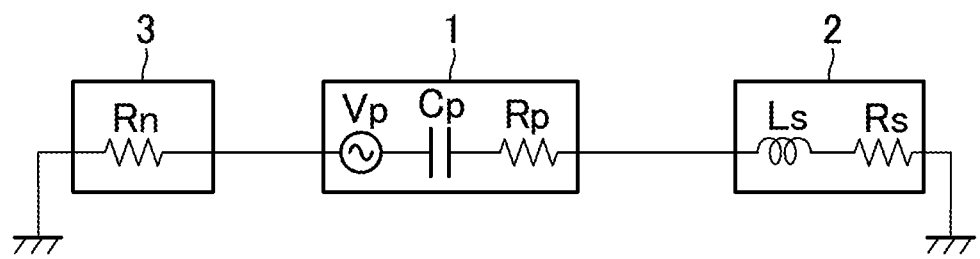
FIG. 2 is a circuit diagram illustrating a configuration of an equivalent circuit of the vibration controller.

FIG. 2 is a circuit diagram illustrating a configuration of an equivalent circuit of the vibration controller illustrated in FIG. 1. As illustrated in FIG. 2, the piezoelectric element 1 can be represented as a circuit in which each of a voltage supply Vp, which generates a voltage responsive to occurrence of distortion in the object of control 4, a parasitic capacitor Cp, and a parasitic resistor Rp are connected in series. The quasi-inductor circuit 2 can be represented as a circuit in which an inductor Ls and a resistor Rs are connected in series. The negative resistance circuit 3 can be represented as a resistor Rn having a negative resistance. As illustrated in FIG. 2, in the vibration controller circuit according to the present embodiment, the quasi-inductor circuit 2 is connected in series to the piezoelectric element 1 and the negative resistance circuit 3 is connected in series to the piezoelectric element 1.

In the present embodiment, a series resonant frequency fr is expressed as $fr=1/\{2\pi\sqrt{(LsCp)}\}$ which is determined by the inductance of the inductor Ls in the quasi-inductor circuit 2 and the capacitance of the parasitic capacitor Cp in the piezoelectric element 1. In this formula and in the formulas described below, for simplification of description, an inductance of the inductor Ls is referred to as "Ls", and a capacitance of the parasitic capacitor Cp is referred to as "Cp". The inductance value of the inductor Ls is set to one where the series resonant frequency fr matches the natural frequency of the object of control 4. In the present embodiment, in a case where the designed series resonant frequency fr matches the natural frequency of vibration of the object of control 4, this matching is called "substantial matching". The concept of substantial matching covers errors.

Figure 3:
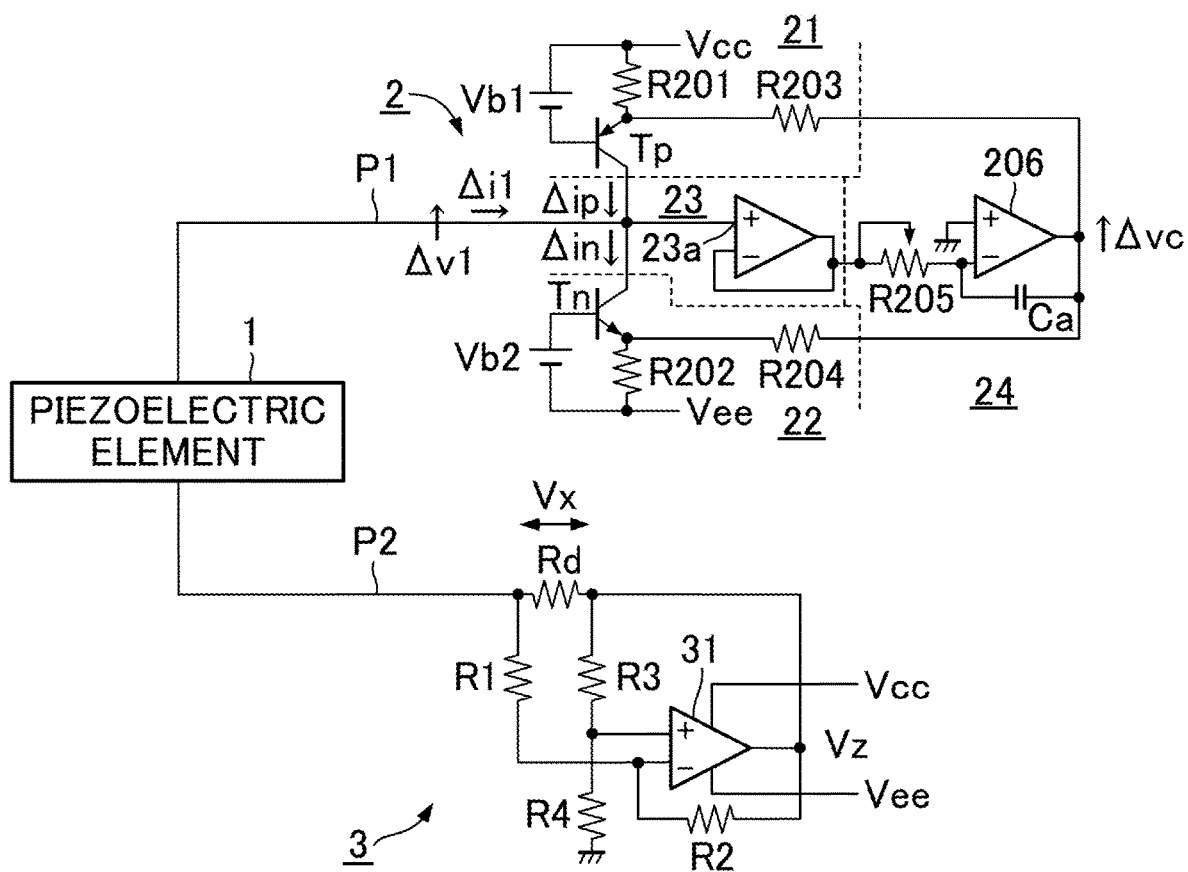
FIG. 3 is a circuit diagram illustrating an example of a specific configuration of a quasi-inductor circuit and that of a negative resistance circuit in the vibration controller.

FIG. 3 is a circuit diagram illustrating a specific configuration of the quasi-inductor circuit 2 and that of the negative resistance circuit 3 in the vibration controller illustrated in FIG. 1.

First, the quasi-inductor circuit 2 will be described. As illustrated in FIG. 3, the quasi-inductor circuit 2 includes a first current feedback amplifier circuit 21; a second current feedback amplifier circuit 22; a voltage follower 23 as a buffer amplifier including an operational amplifier; and an integrating circuit 24.

The voltage follower 23 is an impedance conversion circuit having a high input impedance and a low output impedance. The voltage follower 23 amplifies a voltage at a processing target node P1, to which one electrode of the piezoelectric element 1 is connected, with a gain of 1, and outputs the amplified voltage.

The integrating circuit 24 includes a variable resistor R205, an operational amplifier 206, and an integrating capacitor Ca. The variable resistor R205 is provided between the output terminal of the voltage follower 23 and the inverting input terminal of the operational amplifier 206. The non-inverting input terminal of the operational amplifier 206 is grounded. The integrating capacitor Ca is provided between the output terminal and the inverting input terminal of the operational amplifier 206. In the integrating circuit 24, the integrating capacitor Ca is charged with a current that is determined by dividing an output voltage from the voltage follower 23 by the resistance of the variable resistor R205. As a result, a voltage determined by integrating the output voltage from the voltage follower 23 is output from the operational amplifier 206. Specifically, a voltage determined by integrating the output voltage from a voltage at the processing target node P1 is output from the operational amplifier 206.

The first current feedback amplifier circuit 21 includes a resistor R201, a resistor R203, a PNP transistor Tp, and a DC power supply Vb1. The resistor R201 is provided between a positive power supply Vcc and the emitter of the PNP transistor Tp. The resistor R203 is provided between the output terminal of the operational amplifier 206 and the emitter of the PNP transistor Tp. Specifically, the resistor R203 is provided between the output terminal of the integrating circuit 24 and the emitter of the PNP transistor Tp. The collector of the PNP transistor Tp is connected to the processing target node P1 and a non-inverting input terminal 23a of the voltage follower 23. The non-inverting input terminal 23a is an example of the input terminal of the buffer amplifier. The power supply Vb1 applies a potential that is lower by a predetermined voltage than the potential of the positive power supply Vcc to the base of the PNP transistor Tp. As a result, a forward bias is applied between the base and the emitter of the PNP transistor Tp.

In the first current feedback amplifier circuit 21, after a current from the positive power supply Vcc passes through the resistor R201, the current flows in a distributed manner into the PNP transistor Tp and the resistor R203. If an output voltage from the integrating circuit 24 is increased, a current flowing through the resistor R203 is reduced to increase an emitter current flowing through the PNP transistor Tp by an amount corresponding to the reduction in current. If the output voltage from the integrating circuit 24 is reduced, the current flowing through the resistor R203 is increased to reduce the emitter current flowing through the PNP transistor Tp by an amount corresponding to the increase in current.

The second current feedback amplifier circuit 22 includes a resistor R202, a resistor R204, an NPN transistor Tn, and a DC power supply Vb2. The resistor R202 is provided between a negative power supply Vee and the emitter of the NPN transistor Tn. The resistor R204 is provided between the output terminal of the integrating circuit 24 and the emitter of the NPN transistor Tn. The collector of the NPN transistor Tn is connected to the processing target node P1 and the non-inverting input terminal 23a. The power supply Vb2 applies a potential higher by a predetermined voltage than the potential of the negative power supply Vee to the base of the NPN transistor Tn. As a result, a forward bias is applied between the base and the emitter of the NPN transistor Tn.

In the second current feedback amplifier circuit 22, an emitter current in the NPN transistor Tn and a current supplied from the integrating circuit 24 through the resistor R204 flow into the negative power supply Vee through the resistor R202. If an output voltage from the integrating circuit 24 is increased, a current flowing through the resistor R204 is increased to reduce the emitter current flowing through the NPN transistor Tn by an amount corresponding to the increase in current. If the output voltage from the integrating circuit 24 is reduced, the current flowing through the resistor R204 is reduced to increase the emitter current flowing through the NPN transistor Tn by an amount corresponding to the reduction in current. The configuration of the quasi-inductor circuit 2 is as described above.

In the quasi-inductor circuit 2, assuming that a change in voltage at the processing target node P1 is $\Delta v1$, a change $\Delta vc$ in output voltage from the integrating circuit 24 is given by the following formula. For simplification of description, in the following formulas, the resistances of the resistors R203, R204, and R205 will be referred to as "R203", "R204", and "R205" respectively, and the capacitance of the integrating capacitor Ca will be referred to as "Ca".

$$\Delta vc = -\Delta v1/(R205 \cdot j\omega Ca) \tag{1}$$

In this case, a change $\Delta ip$ in collector current in the PNP transistor Tp and a change $\Delta in$ in collector current in the NPN transistor Tn are given by the following formulas:

$$\Delta ip = -\Delta v1/(R203 \cdot R205 \cdot j\omega Ca) \tag{2}$$

$$\Delta in = \Delta v1/(R204 \cdot R205 \cdot j\omega Ca) \tag{3}$$

Accordingly, a change $\Delta i1$ in current flowing from the piezoelectric element 1 through the processing target node P1 into the quasi-inductor circuit 2 is given by the following formula:

$$\begin{aligned}\Delta i1 &= \Delta in - \Delta ip \\ &= \Delta v1/R204 \cdot R205 \cdot j\omega Ca) + \Delta v1/(R203 \cdot R205 \cdot j\omega Ca)\end{aligned} \tag{4}$$

In the formula, $\Delta i1$ is a current to be negatively fed back to the processing target node P1 and the non-inverting input terminal 23a through the current feedback amplifier circuits 21 and 22, and this negative feedback is caused by the change in voltage at the processing target node P1 by $\Delta v1$. The current $\Delta i1$ flows from the processing target node P1 into the quasi-inductor circuit 2. Thus, impedance Z of the quasi-inductor circuit 2 viewed from the processing target node P1 is expressed by the following formula:

$$\begin{aligned}Z &= \Delta v1/\Delta i1 \\ &= \Delta v1/[\Delta v1/(R204 \cdot R205 \cdot j\omega Ca) + \Delta v1/(R203 \cdot R205 \cdot j\omega Ca)] \\ &= 1/[1/(R204 \cdot R205 \cdot j\omega Ca) + 1/(R203 \cdot R205 \cdot j\omega Ca)]\end{aligned} \tag{5}$$

For the sake of simplicity, assuming that the resistance of R203 and the resistance of R204 are both R20, the foregoing formula is written as follows:

$$Z = (R20 \cdot R205 \cdot j\omega Ca)/2 \tag{6}$$

As will be understood from above, a calculated resistive component Rs is zero for the impedance Z of the quasi-inductor circuit 2, and thus, the impedance Z is determined only by reactance. Due to the presence of interconnection resistance, etc., however, the series parasitic resistor Rs actually exists as illustrated in the equivalent circuit of FIG. 2.

The inductance of the inductor Ls in the quasi-inductor circuit 2 is expressed by the following formula:

$$Ls = (R20 \cdot R205 \cdot Ca)/2 \quad (7)$$

Next, the negative resistance circuit 3 will be described. As illustrated in FIG. 3, the negative resistance circuit 3 includes an operational amplifier 31, and resistors R1, R2, R3, R4, and Rd. The resistor R1 is provided between a processing target node P2 connected to the other electrode of the piezoelectric element 1 and the inverting input terminal of the operational amplifier 31. The resistor R2 is provided between the output terminal and the inverting input terminal of the operational amplifier 31. The resistor R3 is provided between the output terminal and the non-inverting input terminal of the operational amplifier 31. The resistor R4 is provided between the non-inverting input terminal of the operational amplifier 31 and a grounding wire. The resistor Rd is provided between the processing target node P2 and the output terminal of the operational amplifier 31.

Figure 4:
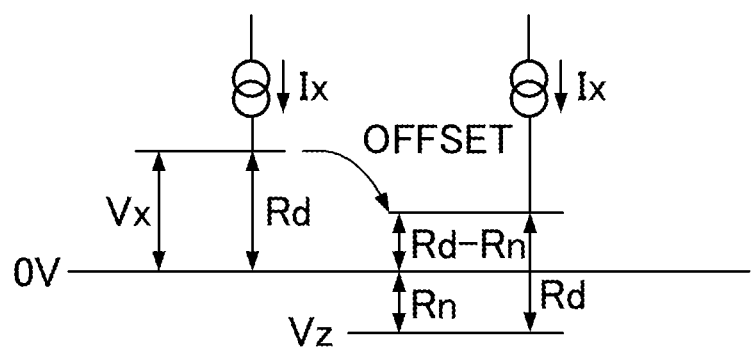
FIG. 4 illustrates a relationship between voltages at respective parts in the negative resistance circuit.

FIG. 4 illustrates a relationship between a voltage and a current at each part in the negative resistance circuit 3 of FIG. 3. The resistance Rn of the negative resistance circuit 3 of FIG. 3 will be discussed with reference to FIG. 4. Regarding the negative resistance circuit 3 of FIG. 3, assuming that a current flowing through the resistor Rd is Ix, a voltage across the resistor Rd is Vx, an output voltage from the operational amplifier 31 is Vz, and an amplifier including the operational amplifier 31 and the resistors R1 to R4 produces a gain A, the relationship as shown below is established. For simplification of description, in the following formulas, the resistances of the resistors R1, R2, R3, R4, and Rd will be called "R1", "R2", "R3", "R4", and "Rd" respectively.

$$A = \{R4/(R3+R4)\} \cdot \{(R2/R1)+1\} \quad (8)$$

$$Vx = Rd \cdot Ix \quad (9)$$

$$Vz = Vx \cdot (-A) \quad (10)$$

Substituting the formula (9) into the formula (10) produces the following formula:

$$Vz = -Rd \cdot Ix \cdot A \quad (11)$$

The resistor Rd is as follows: The resistor Rd has one end connected to a constant current supply for the current value Ix, and an opposite end connected to the constant voltage supply Vz for the output terminal of the operational amplifier 31. The resistor Rd is in a high impedance state. In this case, a voltage at the resistor Rd closer to the constant current supply has an offset resulting from the constant voltage supply Vz. This offset voltage is applied to the resistor Rn in the negative resistance circuit 3. Accordingly, the resistance of the resistor Rn in the negative resistance circuit 3 is expressed by the following formula:

$$\begin{aligned} Rn &= (Vx - Ix \cdot Rd \cdot A)/Ix \\ &= Vx/Ix - Rd \cdot A \end{aligned} \quad (12)$$

If the relationship of Vx/Ix=Rd obtained from the foregoing formula (9) is substituted into the foregoing formula (12), the resistance of the resistor Rn is expressed by the following formula:

$$\begin{aligned} Rn &= Rd - Rd \cdot A \\ &= Rd(1-A) \end{aligned} \quad (13)$$

As will be understood from the formula (13), if A>1, the resistance of the resistor Rn takes a negative value. Regarding the foregoing formula (8), the gain A changes in response to the changes in the respective resistances of the resistors R1 to R4. As the gain A increases, the absolute value of the resistance of the resistor Rn increases. The configuration of the present embodiment is as described above.

Next, actions and effects achieved by this embodiment will be described. In the present embodiment, there is provided a resonant circuit including the piezoelectric element 1, the quasi-inductor circuit 2, and the negative resistance circuit 3. In the resonant circuit, existence of parasitic resistor is unavoidable, such as the parasitic resistor Rp in the piezoelectric element 1, for example. In the present embodiment, however, this parasitic resistor can be offset by the resistor Rn in the negative resistance circuit 3. In this way, the present embodiment enables effective damping of the vibration of the object of control 4 by enhancing the Q of the resonant circuit.

Figure 5A:
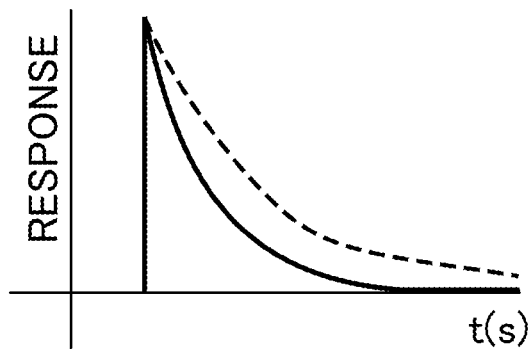
FIG. 5A illustrates operation in the first embodiment.
Figure 5B:
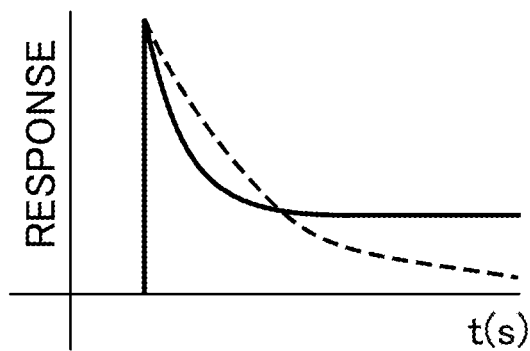
FIG. 5B illustrates operation in the first embodiment.
Figure 5C:
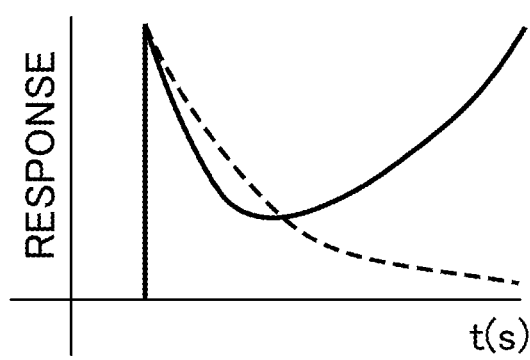
FIG. 5C illustrates operation in the first embodiment.

Further, in the present embodiment, the resistance of the negative resistance circuit 3 viewed from the processing target node P2 changes in response to a change in the gain A of the negative resistance circuit 3. This achieves vibration control over the object of control 4 in a variety of ways. FIGS. 5A, 5B, and 5C each illustrate an example of an impulse response of the object of control 4 determined by changing the gain A of the negative resistance circuit 3. The resistance of the resistor Rd in the negative resistance circuit 3 is set to 10Ω. In each of these drawings, a horizontal axis illustrates time t (s), while a vertical axis illustrates impulse response. More specifically, the vertical axis illustrates the amplitude of the vibration of an object of control. To facilitate understanding of the effect achieved by the present embodiment, in FIGS. 5A to 5C, solid lines indicate impulse response in the presence of the negative resistance circuit 3, and dashed lines indicate impulse response in the absence of the negative resistance circuit 3.

In the example illustrated in FIG. 5A, the gain A of the negative resistance circuit 3 is set at a value below a range from 15 to 20. Further, the absolute value of the resistance of the resistor Rn is smaller than the absolute value of the resistance of the parasitic resistor in the vibration controller (resonant circuit). In this state, the following relationship is established between the resistors Rp, Rs, and Rn in FIG. 2: the resistance of the resistor Rp+the resistance of the resistor Rs+the resistance of the resistor Rn>0. Thus, the vibration energy of the object of control 4 is reduced by the resistor Rp, the resistor Rs, and the resistor Rn to damp the vibration of the object of control 4. Specifically, this example works effectively for damping vibration. In this state, as the absolute value of the resistance of the resistor Rn in the negative resistance circuit 3 is reduced by reducing the gain A of the negative resistance circuit 3, the resistance of the resonant circuit (the resistance of the resistor Rp+the resistance of the resistor Rs+the resistance of the resistor Rn) is increased. As a result, the vibration of the object of control 4 is damped over a longer time. In this way, in a case where the object of control 4 is a housing of an acoustic unit such as a speaker, for example, the present embodiment enables control of a timbre of acoustic equipment.

In the example illustrated in FIG. 5B, the gain A of the negative resistance circuit 3 is set at a value within the range from 15 to 20. Further, the absolute value of the resistance of the resistor Rn matches the absolute value of the resistance of the parasitic resistor in the vibration controller (resonant circuit). In this state, the following relationship is established between the resistors Rp, Rs, and Rn of FIG. 2: the resistance of the resistor Rp+the resistance of the resistor Rs+the resistance of the resistor Rn=0. Thus, the vibration energy of the object of control 4 is not reduced by the resistor Rp, the resistor Rs, and the resistor Rn, and whereby undamped vibration is generated at the object of control 4. In this way, according to the present embodiment in a case where the object of control 4 is, for example, a housing of an acoustic unit such as a speaker, emission of long tones from acoustic equipment is enabled.

In the example illustrated in FIG. 5C, the gain A of the negative resistance circuit 3 is set at a value above the range from 15 to 20. Further, the absolute value of the resistance of the resistor Rn is larger than the absolute value of the resistance of the parasitic resistor in the vibration controller (resonant circuit). In this state, the following relationship is established between the resistors Rp, Rs, and Rn of FIG. 2: the resistance of the resistor Rp+the resistance of the resistor Rs+the resistance of the resistor Rn<0. Thus, the resistor Rp, the resistor Rs, and the resistor Rn, the sum of which has a negative value, generate an excitation action that increases the vibration energy of the object of control 4.

As described above, in the present embodiment, the gain A of the negative resistance circuit 3 is changed to change the resistance Rn, so that the vibration of the object of control 4 can be controlled in a variety of ways.

Second Embodiment

Figure 6:
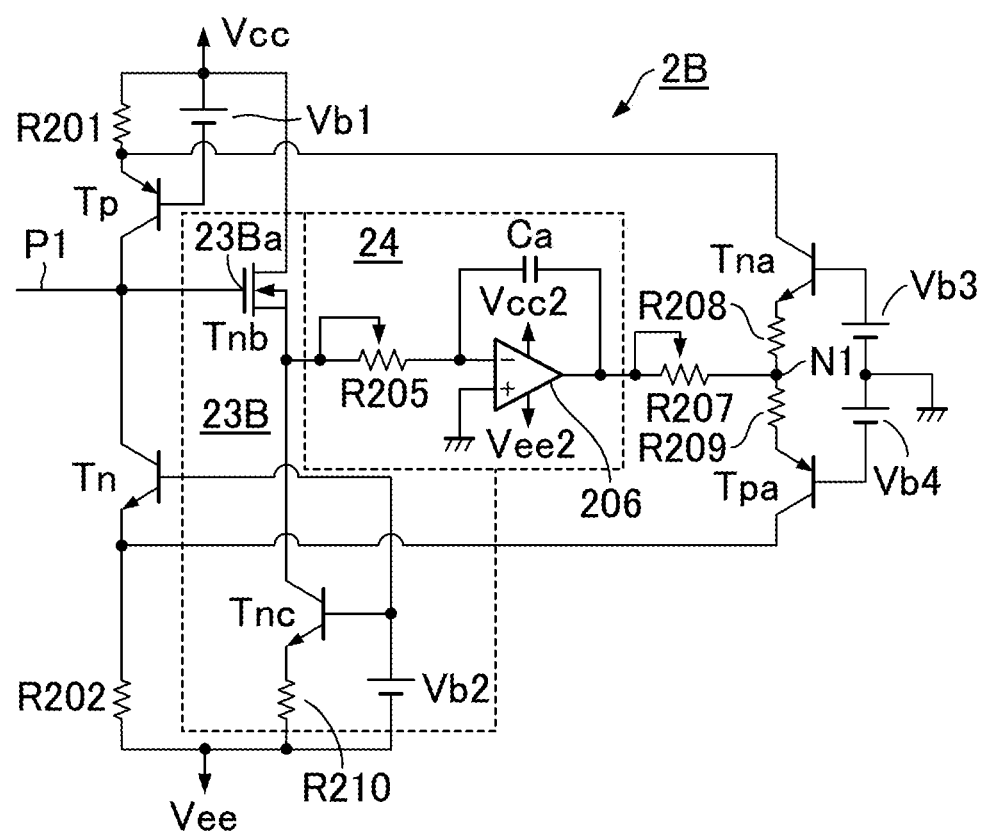
FIG. 6 is a circuit diagram illustrating a configuration of a quasi-inductor circuit 2B used in a vibration controller according to a second embodiment of this invention.

FIG. 6 is a circuit diagram illustrating a configuration of a quasi-inductor circuit 2B used in a vibration controller according to a second embodiment of this invention. The quasi-inductor circuit 2B differs from the quasi-inductor circuit 2 of the first embodiment as follows: the quasi-inductor circuit 2B includes a source follower 23B as a buffer amplifier instead of the voltage follower 23; the resistors R203 and R204 are omitted from the quasi-inductor circuit 2B; and the quasi-inductor circuit 2B additionally includes a variable resistor R207, a resistor R208, a resistor R209, an NPN transistor Tna, a PNP transistor Tpa, a DC power supply Vb3, and a DC power supply Vb4. A part of a first current feedback amplifier circuit is formed by the variable resistor R207, the resistor R208, the NPN transistor Tna, and the power supply Vb3. A part of a second current feedback amplifier circuit is formed by the variable resistor R207, the resistor R209, the PNP transistor Tpa, and the power supply Vb4.

The power supply Vb3 applies a potential that is higher by a predetermined voltage than the potential of a grounding wire, to the base of the NPN transistor Tna. Conversely, the power supply Vb4 applies a potential that is lower by a predetermined voltage than the potential of the grounding wire, to the base of the PNP transistor Tpa. The collector of the NPN transistor Tna is connected to the emitter of the PNP transistor Tp. The collector of the PNP transistor Tpa is connected to the emitter of the NPN transistor Tn. The resistors R208 and R209 are connected in series. They are provided between the emitter of the NPN transistor Tna and the emitter of the PNP transistor Tpa. A connection node N1 between the resistor R208, and the resistor R209 is virtually grounded by providing uniform characteristics between the resistor R208 and the resistor R209, between the NPN transistor Tna and the PNP transistor Tpa, and the power supply Vb3 and the power supply Vb4.

The variable resistor R207 is provided between the output terminal of the operational amplifier 206 and the virtually grounded node N1. Specifically, the variable resistor R207 is provided between the output terminal of the integrating circuit 24 and the virtually grounded node N1. If the integrating circuit 24 outputs a negative voltage, a current proportionate to this voltage flows from the node N1 into the output terminal of the integrating circuit 24 through the variable resistor R207. The NPN transistor Tna returns a collector current responsive to this current flowing through the variable resistor R207 as feedback to the emitter of the PNP transistor Tp. If the integrating circuit 24 outputs a positive voltage, a current proportionate to this voltage flows from the output terminal of the integrating circuit 24 into the node N1 through the variable resistor R207. The PNP transistor Tpa feeds a collector current responsive to this current flowing through the variable resistor R207 back to the emitter of the NPN transistor Tn.

The source follower 23B includes an n-channel metal-oxide-semiconductor field-effect transistor (MOSFET, which will simply be referred to as a transistor) Tnb, an NPN transistor Tnc, a resistor R210, and the power supply Vb2. The transistor Tnb has a gate 23Ba connected to the processing target node P1. The gate 23Ba is an example of the input terminal of the buffer amplifier. The drain of the transistor Tnb is connected to the positive power supply Vcc. The source of the transistor Tnb is connected to the input side end of the variable resistor R205 and the collector of the NPN transistor Tnc. Specifically, the source of the transistor Tnb is connected to the input terminal of the integrating circuit 24 and the collector of the NPN transistor Tnc. The resistor R210 is provided between the negative power supply Vee and the emitter of the NPN transistor Tnc. The power supply Vb2 applies a potential that is higher by a predetermined voltage than the potential of the negative power supply Vee, to the base of the NPN transistor Tnc. A circuit including the NPN transistor Tnc, the resistor R210, and the power supply Vb2 is a constant current circuit for flowing a negative current through the integrating circuit 24 if a negative voltage is generated at the processing target node P1.

The positive power supply terminal of the operational amplifier 206 in the integrating circuit 24 is connected to a positive power supply Vcc2 used for a general-purpose operational amplifier. The negative power supply terminal of the operational amplifier 206 is connected to a negative power supply Vee2 used for a general-purpose operational amplifier.

The quasi-inductor circuit 2B includes the variable resistor R205 and the variable resistor R207, the resistances of which are adjustable. Thus, it is possible to determine the inductance of the inductor Ls by adjusting the resistance of the variable resistor R205 and the resistance of the variable resistor R207. In the quasi-inductor circuit 2B, to ensure a desired signal-to-noise ratio, the respective resistances of the variable resistors R205 and R207 are adjusted so as to realize the highest possible value of an output voltage from the integrating circuit 24 within an operating voltage range of the operational amplifier 206. The resistance of the variable resistor R205 may be adjusted to an extremely large value or an extremely small value according to the inductance value of the inductor Ls. This gives rise to a risk, however, in that the value of a current caused to flow by the constant current circuit (including the NPN transistor Tnc, the resistor R210, and the power supply Vb2) may exceed a capability of the constant current circuit. This risk can be obviated by changing a capacitance of the integrating capacitor Ca to an appropriate value.

In the quasi-inductor circuit 2 of the first embodiment, a voltage at the positive power supply Vcc or the negative power supply Vee is used as a reference potential for conversion of an output voltage from the integrating circuit 24 to a current. In the first embodiment, a change in voltage at the positive power supply Vcc or the negative power supply Vee may cause a change in current to be fed back to the processing target node P1 and the non-inverting input terminal 23a. This gives rise to a risk of a change in the inductance of the inductor Ls in the quasi-inductor circuit 2.

By contrast, in the quasi-inductor circuit 2B of the present embodiment, one end of the variable resistor 8207, which converts an output voltage from the integrating circuit 24 to a current, is connected to the virtually grounded node N1, whereby a ground potential can be used as a reference potential for the conversion to a current. Thus, in the quasi-inductor circuit 2B, the value of a current to be fed back to the processing target node P1 and the gate 23Ba does not change as a result of a change in voltage at the positive power supply Vcc or at the negative power supply Vee. As a result, in the quasi-inductor circuit 2B, the inductance of the inductor Ls does not change.

The processing target node P1 connected to one electrode of the piezoelectric element 1 is subject to a risk of generation of a relatively large voltage. Hence, if as in the first embodiment the voltage follower 23 including an operational amplifier is used as a buffer amplifier, a possibility exists that a voltage input to the voltage follower 23 may exceed an operating voltage range of the operational amplifier. This could be obviated, for example, by use of a discrete element to form the operational amplifier in the voltage follower 23. Use of a discrete element to form the operational amplifier requires use of multiple transistors as discrete elements, and consequently a relatively large area is required for mounting multiple transistors as discrete elements.

In contrast, in the quasi-inductor circuit 2B of the present embodiment, the source follower 23B is used as a buffer amplifier. In the quasi-inductor circuit 2B, even if a relatively large voltage is generated at the processing target node P1, this voltage generation can be handled only by using a discrete element as the transistor Tnb in the source follower 23B without requiring multiple discrete elements for forming the voltage follower 23. In this way, in the quasi-inductor circuit 2B a number of discrete elements can be reduced compared to the quasi-inductor circuit 2. This reduction in the number of discrete elements saves space for the quasi-inductor circuit 2B.

In the quasi-inductor circuit 2B, the output terminal of the integrating circuit 24 is virtually grounded through the variable resistor R207. Additionally, the resistance of the variable resistor R205 is adjustable. Thus, even if a relatively large voltage is generated at the processing target node P1, a current flowing through the integrating circuit 24 becomes smaller. As a result, in the quasi-inductor circuit 2B, the operational amplifier 206 can be driven with the same power supply voltage as used by a general-purpose operational amplifier. This configuration makes it possible to form the operational amplifier 206 using a monolithic integrated circuit.

As described above, the quasi-inductor circuit 2B enables accurate control of a current to be fed back to the processing target node P1 and the gate 23Ba. Accordingly, the accuracy in setting the inductance of the inductor Ls is enhanced. Further, the quasi-inductor circuit 2B can be designed in a readily manner compared to the quasi-inductor circuit 2 of the first embodiment. It is also possible to save in space for implementing the quasi-inductor circuit 2B.

Third Embodiment

Figure 7:
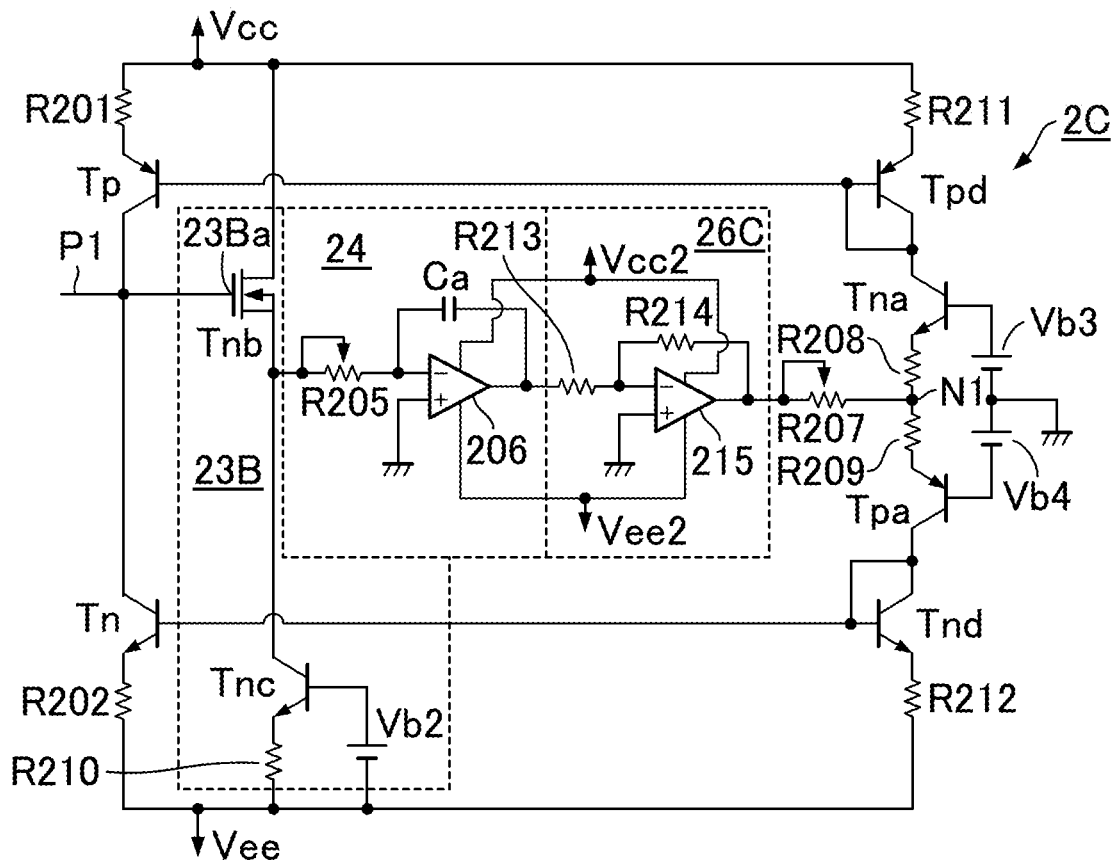
FIG. 7 is a circuit diagram illustrating a configuration of a quasi-inductor circuit 2C used in a vibration controller according to a third embodiment of this invention.

FIG. 7 is a circuit diagram illustrating a configuration of a quasi-inductor circuit 2C used in a vibration controller according to a third embodiment. The quasi-inductor circuit 2C differs from the quasi-inductor circuit 2B of the second embodiment in the following: the power supply Vb1 is omitted from the quasi-inductor circuit 2C; and the quasi-inductor circuit 2C additionally includes an inverting amplifier circuit 26C, a PNP transistor Tpd, an NPN transistor Tnd, a resistor R211, and a resistor R212.

The resistor R211 is provided between the positive power supply Vcc and the emitter of the PNP transistor Tpd. The collector of the PNP transistor Tpd is connected to the collector of the NPN transistor Tna. The base of the PNP transistor Tpd is connected to the collector of the PNP transistor Tpd and the base of the PNP transistor Tp. The PNP transistor Tpd and the PNP transistor Tp form a current mirror circuit. In the current mirror circuit, a current of the same value as a collector current in the PNP transistor Tpd flows through the collector of the PNP transistor Tp.

The resistor R212 is provided between the negative power supply Vee and the emitter of the NPN transistor Tnd. The collector of the NPN transistor Tnd is connected to the collector of the PNP transistor Tpa. The base of the NPN transistor Tnd is connected to the collector of the NPN transistor Tnd and the base of the NPN transistor Tn. The NPN transistor Tnd and the NPN transistor Tn form a current mirror circuit. In the current mirror circuit, a current of the same value as a collector current in the NPN transistor Tnd flows through the collector of the NPN transistor Tn.

The inverting amplifier circuit 26C includes a resistor R213, a resistor R214, and an operational amplifier 215. The resistor R213 is provided between the output terminal of the operational amplifier 206 and the inverting input terminal of the operational amplifier 215. Specifically, the resistor R213 is provided between the output terminal of the integrating circuit 24 and the inverting input terminal of the operational amplifier 215. The non-inverting input terminal of the operational amplifier 215 is grounded. The resistor R214 is provided between the output terminal and the inverting input terminal of the operational amplifier 215. The positive power supply terminal of the operational amplifier 215 is connected to the positive power supply Vcc2 used for a general-purpose operational amplifier. The negative power supply terminal of the operational amplifier 215 is connected to the negative power supply Vee2 used for a general-purpose operational amplifier. The inverting amplifier circuit 26C inverts the phase of an output voltage from the integrating circuit 24.

If the integrating circuit 24 outputs a negative voltage, a positive voltage of a phase inverted from the negative voltage is output from the inverting amplifier circuit 26C. In this case, a current proportionate to the output voltage from the inverting amplifier circuit 26C flows from the output terminal of the inverting amplifier circuit 26C into the node N1 through the variable resistor R207. The PNP transistor Tpa supplies a collector current responsive to the current flowing through the variable resistor R207 to the collector of the NPN transistor Tnd. The collector current flowing through the NPN transistor Tnd causes a current of the same value as that of the collector current to flow from the processing target node P1 into the collector of the NPN transistor Tn.

If the integrating circuit 24 outputs a positive voltage, a phase-inverted negative voltage of the positive voltage is output from the inverting amplifier circuit 26C. In this case, a current proportionate to the output voltage from the inverting amplifier circuit 26C flows from the node N1 into the output terminal of the inverting amplifier circuit 26C through the variable resistor 8207. A collector current responsive to the current flowing through the variable resistor R207 is supplied from the collector of the PNP transistor Tpd to the NPN transistor Tna. The collector current flowing through the NPN transistor Tpd causes a current of the same value as that of the collector current to flow from the collector of the PNP transistor Tp into the processing target node P1.

As described above, in the quasi-inductor circuit 2C, the current mirror circuit causes a current converted by the variable resistor 8207 to flow as a current for input to or output from the processing target node P1. Thus, in the quasi-inductor circuit 2C, an idling current for flow through a first-stage circuit, which circuit includes the PNP transistor Tp, the NPN transistor Tn, and the resistors 8201 and 8202, can be set low to reduce power consumption.

The quasi-inductor circuit 2C includes the inverting amplifier circuit 26C for adjusting the phase of a feedback current in order to negatively feed back to the processing target node P1 and the gate 23B a current responsive to an output voltage from the integrating circuit 24. This increases the number of operational amplifiers in the quasi-inductor circuit 2C by one corresponding to the operational amplifier 215 in the inverting amplifier circuit 26C, compared to the number of operational amplifiers in the quasi-inductor circuit 2B. A current for flow through the integrating circuit 24 and the inverting amplifier circuit 26C is small, and thus general-purpose operational amplifiers can be used as the operational amplifier 206 and the operational amplifier 215. A general-purpose operational amplifier is generally mounted as two circuits in one package. Thus, the operational amplifier 206 and the operational amplifier 215 can each be realized within a single package. In this way, use of the quasi-inductor circuit 2C can reduce or at least prevent an increase in space required for the quasi-inductor circuit 2C, which would otherwise result from the addition of the operational amplifier 215.

Different Embodiments

While the first to third embodiments of the present invention are described above, other embodiments of this invention are conceivable. Hereafter, different exemplary embodiments are described.

Figure 8:
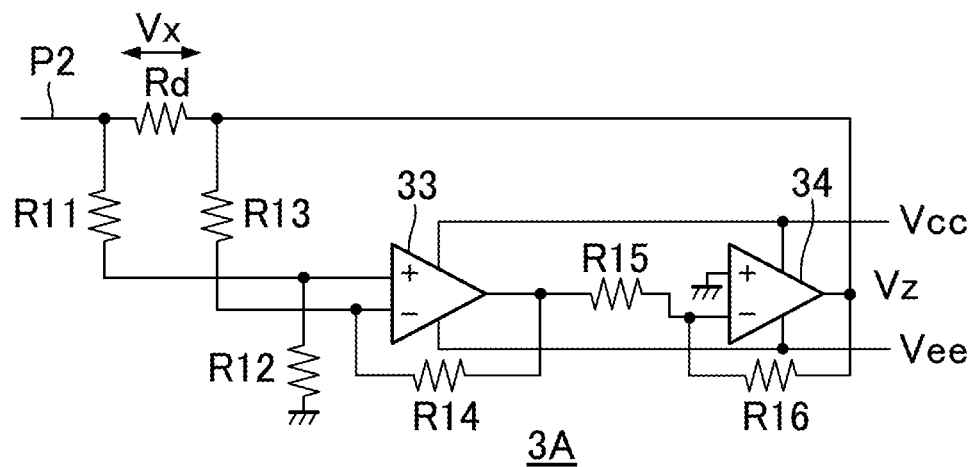
FIG. 8 is a circuit diagram illustrating a configuration of a negative resistance circuit used in a vibration controller according to a different embodiment.

(1) The negative resistance circuit 3 may be replaced by a negative resistance circuit 3A illustrated in FIG. 8. As illustrated in FIG. 8, the negative resistance circuit 3A includes resistors R11, R12, R13, R14, R15, R16 and Rn, and operational amplifiers 33 and 34. The resistor Rd is provided between the processing target node P2 and the output terminal of the operational amplifier 34. The resistor R11 is provided between the processing target node P2 and the non-inverting input terminal of the operational amplifier 33. The resistor R12 is provided between the non-inverting input terminal of the operational amplifier 33 and a grounding wire. The resistor R13 is provided between the output terminal of the operational amplifier 34 and the inverting input terminal of the operational amplifier 33. The resistor R14 is provided between the inverting input terminal and the output terminal of the operational amplifier 33. The resistor R15 is provided between the output terminal of the operational amplifier 33 and the inverting input terminal of the operational amplifier 34. The resistor R16 is provided between the inverting input terminal and the output terminal of the operational amplifier 34. The non-inverting input terminal of the operational amplifier 34 is grounded.

In the negative resistance circuit 3 illustrated in FIG. 3, a circuit that amplifies a voltage across the resistor Rd and outputs the amplified voltage as the voltage Vz is formed by a one-stage amplifier having the operational amplifier 31. In contrast, in the negative resistance circuit 3A illustrated in FIG. 8 a circuit that amplifies a voltage across the resistor Rd and outputs the amplified voltage as the voltage Vz is formed by a two-stage amplifier having the operational amplifiers 33 and 34. Accordingly, the gain A produced in FIG. 8 differs from the gain A produced in FIG. 3. Except for this point, the negative resistance circuit 3A illustrated in FIG. 8 is basically the same as the negative resistance circuit 3 illustrated in FIG. 3. Thus, also in the embodiment illustrated in FIG. 8, a negative resistor is used for the resistor Rn in the negative resistance circuit 3A, where the resistance of the resistor Rn is adjustable. As a result, effects comparable to those achieved by the foregoing embodiments can be attained by applying the negative resistance circuit 3A to each of the foregoing embodiments.

(2) In each of the foregoing embodiments, the quasi-inductor circuit 2, 2B, or 2C is used in the vibration controller. Alternatively, a normal inductor may be used.

(3) In each of the foregoing embodiments, the vibration controller may be applied to acoustic equipment. In this case, the vibration controller may be configured to adjust the resistance Rn of the negative resistance circuit 3 in response to operation via a remote controller for control of the acoustic equipment, for example.

The following aspect is understood from at least one of the foregoing embodiments and the foregoing modifications.

In one aspect of the vibration controller according to the present invention, the vibration controller includes: a piezoelectric element fixed to an object of control; and an inductor and a negative resistance circuit, both of which are connected in series to the piezoelectric element.

In this aspect, a resonant circuit is formed by a parasitic capacitor in the piezoelectric element, the inductor, and the negative resistance circuit. A negative resistor realized by the negative resistance circuit offsets the parasitic resistor in the resonant circuit. As a result, the Q of the resonance of the resonant circuit can be enhanced.

In the foregoing aspect of the vibration controller, the negative resistance circuit has a variable resistance. According to this aspect, the resistance of the negative resistance circuit can be changed depending on different modes for controlling vibration generated at the object of control, so that vibration of the object of control is reduced in one mode, and undamped vibration is generated at the object of control in another mode, or the object of control is excited in still another mode. Vibration control over the object of control in a variety of ways is thus realized.

DESCRIPTION OF REFERENCE SINGS

1 . . . Piezoelectric element
2, 2B, 2C . . . Quasi-inductor circuit
3, 3A . . . Negative resistance circuit
4 . . . Object of control
Vp . . . Voltage supply
Cp . . . Parasitic capacitor
Rp, Rs . . . Parasitic resistor
Rn . . . Negative resistor
Ls . . . Inductance

What is claimed is:

1. A vibration controller comprising:
   a piezoelectric element configured to be fixed to an object of control; and
   an inductor and a negative resistance circuit connected in series to the piezoelectric element,
   wherein:
   the negative resistance circuit has a resistance Rn that is adjustable,
   the piezoelectric element includes a parasitic resistor having a resistance Rp,
   the inductor includes a parasitic resistor having a resistance Rs, and
   in response to a change of the resistance Rn of the negative resistance circuit, a sum of Rn+Rp+Rs is changeable from a negative value to a positive value.

2. The vibration controller according to claim 1, wherein the inductor is a quasi-inductor circuit comprising:
   a buffer amplifier configured to output a signal responsive to an output signal from the piezoelectric element;
   an integrator configured to integrate the output signal from the buffer amplifier; and
   a current feedback circuit configured to negatively feed back to an input terminal of the buffer amplifier a current responsive to an output signal from the integrator.

3. The vibration controller according to claim 1, wherein a resonant frequency of a resonant circuit including the inductor and a parasitic capacitor in the piezoelectric element substantially matches a resonant frequency of the object of control.

4. A vibration controller comprising:
   a piezoelectric element configured to be fixed to an object of control; and
   an inductor and a negative resistance circuit connected in series to the piezoelectric element,
   wherein the inductor is a quasi-inductor circuit comprising:
   a buffer amplifier configured to output a signal responsive to an output signal from the piezoelectric element;
   an integrator configured to integrate the output signal from the buffer amplifier; and
   a current feedback circuit configured to negatively feed back to an input terminal of the buffer amplifier a current responsive to an output signal from the integrator.

* * * * *